Dec. 20, 1966 R. EMEIS 3,293,509

SEMICONDUCTOR DEVICES WITH TERMINAL CONTACTS AND METHOD OF THEIR PRODUCTION

Filed Dec. 27, 1962 2 Sheets-Sheet 2

United States Patent Office
3,293,509
Patented Dec. 20, 1966

3,293,509

SEMICONDUCTOR DEVICES WITH TERMINAL CONTACTS AND METHOD OF THEIR PRODUCTION

Reimer Emeis, Ebermannstadt, Germany, assignor to Siemens-Schuckertwerke Aktiengesellschaft, Berlin-Siemensstadt, Germany, a corporation of Germany Filed Dec. 27, 1962, Ser. No. 247,658
Claims priority, application Germany, Dec. 30, 1961, S 77,373
17 Claims. (Cl. 317—234)

My invention relates to p-n junction diodes, transistors, semiconductor controlled rectifiers, and other electronic semiconductor devices, and more particularly to broad-area contact connections and their production in conjunction with such devices. In one of its preferred aspects, the invention is also related to, and a further development and improvement of, semiconductor devices as disclosed in my copending applications Serial No. 209,047, filed July 11, 1962; Serial No. 220,336, filed August 29, 1962, and Serial No. 239,201, filed November 21, 1962, all assigned to the assignee of the present invention.

More specifically, the semiconductor devices with which my invention is concerned comprise an essentially monocrystalline semiconductor body in broad-area connection with a carrier plate of good electrical and thermal conductance whose thermal coefficient of expansion does not appreciably differ from that of the semiconductor material so as to prevent mechanical damage to the crystal due to changes in temperature as occurring in the operation of the device. For semiconductors of silicon or germanium, the carrier plate may consist of molybdenum or tungsten, for example. As a rule, the carrier plate is joined with a heat-sink structure, such as a block of copper having cooling vanes, or with a member of a coolant water circulation system. The term "broad-area" is used herein to denote a connection or face-to-face contact engagement of such a large size that different thermal expansion of the adjoining structures would cause trouble or damage, this being the case with contacting or bonding areas of more than 1 mm.$^2$, particularly with areas of up to several cm.$^2$ having more than 1 mm. length and width.

The connection of the carrier plate with the heat-sink structure must occupy a largest feasible area for good heat transfer and slight electrical resistance at the transition. When using soft solder, for example tin or lead solder, for joining the carrier plate with the heat sink, it may happen that high electric loads and a correspondingly intensive generation of heat will locally heat the solder beyond the melting temperature, thus impairing or loosening the bond. When employing hard solder, such as silver solder or the like, the necessary high brazing temperature may detrimentally affect the properties of the semiconductor member previously firmly bonded with the carrier plate. The application of pressure, fluxing agent and other expedients for the production of such solder joints, tends to be accompanied by noxious side effects, such as mechanical tension or impurities, which affect the electrical properties of the semiconductor device or may jeopardize achieving or preserving these properties.

It is an object of my invention to minimize or obviate the shortcomings of the known semiconductor devices with broad-area contacts of the kind mentioned.

Another object, constituting a concept underlying the present invention, is to join the semiconductor body, usually comprising a plurality of regions of different electric conductance properties, with a thermally matched carrier or compensating plate of metal by a reliable broad-area bond, but to afford producing such bond at a manufacturing stage subsequent to the production of the semiconductor or p-n junction member proper. More specifically, it is an object to produce the just-mentioned broad-area bond during or after assembling the semiconductor member and the metal plate with the other components of the semiconductor device, such as a cooling block, part of a mounting frame, a housing, contact terminals or other structures serving for combining or connecting the semiconductor device with other circuit components of the same or other type.

Still another object, subsidiary to the one last mentioned, is to afford integrally bonding the thermally similar metal plate to an electrode of the crystalline semiconductor body after that body is already processed to contain one or more p-n junctions or other desired electrical qualities, and requiring the application only of such a low bonding temperature, preferably below the maximum temperature subsequently reached by the device when in normal operation, as to prevent impairing the pre-established semiconductor qualities.

A further object of my invention is to provide the electrode of a crystalline semiconductor body with a broad-area contact and permanent current-conducting junction by thermo-compression without the necessity of applying joining tools or expedients other than simply assembling the semiconductor device and then moderately heating it as a whole, either in a subsequent stage of manufacture or by letting the device be heated in subsequent normal electrical use.

Another object of my invention akin to the one last mentioned, is to secure a reliable broad-area junction between a semiconductor electrode and an adjacent thermo-similar metal plate of a terminal structure, by mechanical pressure engagement of such type as to become subsequently improved due to the progressing coalescence of the junction, thus reliably affording immediate use of the semiconductor device when assembled, with the assurance that thermal effects will improve the junction.

Still another object of the invention is to provide a semiconductor device in which the semiconductor member proper is contacted at opposite sides by respective terminal structures of which one, when the device is completed, forms a rigid integral junction with the semiconductor member whereas the other terminal structure forms a glidable pressure engagement to permit lateral motion for compensation of differences in thermal coefficient of expansion. More specifically, relating to such a device, it is an object of my invention to afford assembling the entire device, including the components of the two different types of terminal junctions, and to thereafter obtain the desired difference in type or behavior of the two junctions by heating the assembly.

To achieve these objects, and in accordance with a feature of my invention, a rigid and permanent broad-area connection between the metallic surface electrode, for example of gold or gold-semiconductor eutectic, on a crystalline semiconductor body, such as of silicon or germanium, and a contacting plate of molybdenum, tungsten or other metal having a thermal coefficient of expansion similar to that of the semiconductor body, is produced as follows: I coat the contacting plate at its contact surface with a metal that is the same as, or similar to, the metal contained in the electrode of the semiconductor member. For example, if the electrode consists substantially of gold, the coating consists also of gold or it may consist of another metal such as silver, which will easily alloy with the gold-containing electrode. Furthermore, I give at least one of the two mutually engaging contact surfaces of the electrode and the coating a uniform surface roughness with a roughness depth between 0.5 and 50 microns, preferably between 1 and 3 microns; and each of these two contact surfaces is made planar to such a degree that any departures of the median surface from a geometric plane are not larger than the roughness depth. As mentioned, the metal content of the contact electrode on the crystalline semiconductor body, as well as the contact coating on the contact or pressure plate preferably consists of a noble metal such as silver or gold.

A pressure contact connection of this type can be produced mechanically by assembling it without application of heat. Another advantage is the fact that, prior to assembling the semiconductor member with the pressure plate, the latter can be separately provided with an electrical connection of copper or another good conducting metal in the usual manner by soldering or welding. This can be done while the pressure plate is kept remote from the semiconductor member so that the above-mentioned impairment of the electrical qualities of the semiconductor member by soldering or welding temperatures is reliably obviated.

It has been found in practical use of pressure contact connections according to the invention, that the contact surfaces firmly coalesce and then form an integral body after some period of operation under normal load conditions at which the maximum permissible operating temperature is not exceeded. Tests, involving a forceful separation of the pressure plate from the semiconductor member, have shown that the separation does not, as a rule, occur at the pressure contact surfaces but that the alloy electrode remains firmly bonded with the pressure plate and breaks out of the semiconductor body.

The same inseparable junction between the pressure-contact surfaces has also been obtained, prior to placing the semiconductor device into actual operation, by heating the assembled device extraneously, for example in a furnace, up to substantially the same temperatures and for substantially the same length of time as required for coalescence under electrical operating conditions. The temperatures thus required were above 100° C. but need not be higher than about 300° C., and a processing period of one or several days is usually sufficient. However, these values are not critical because, when applying a sufficient mechanical area pressure between 50 and 500 kg. per cm.$^2$, the contact junction is electrically and thermally well conductive initially without coalescence and thereafter improves progressively when electrically heated in normal operation while the contact engagement is still being kept under pressure.

The foregoing and other objects, advantages and features of my invention, said features being set forth with particularity in the claims annexed hereto, will be apparent from, and will be mentioned in, the following with reference to the embodiments of semiconductor devices according to the invention illustrated by way of example in the accompanying drawings, in which:

Figures 1, 2, 3:
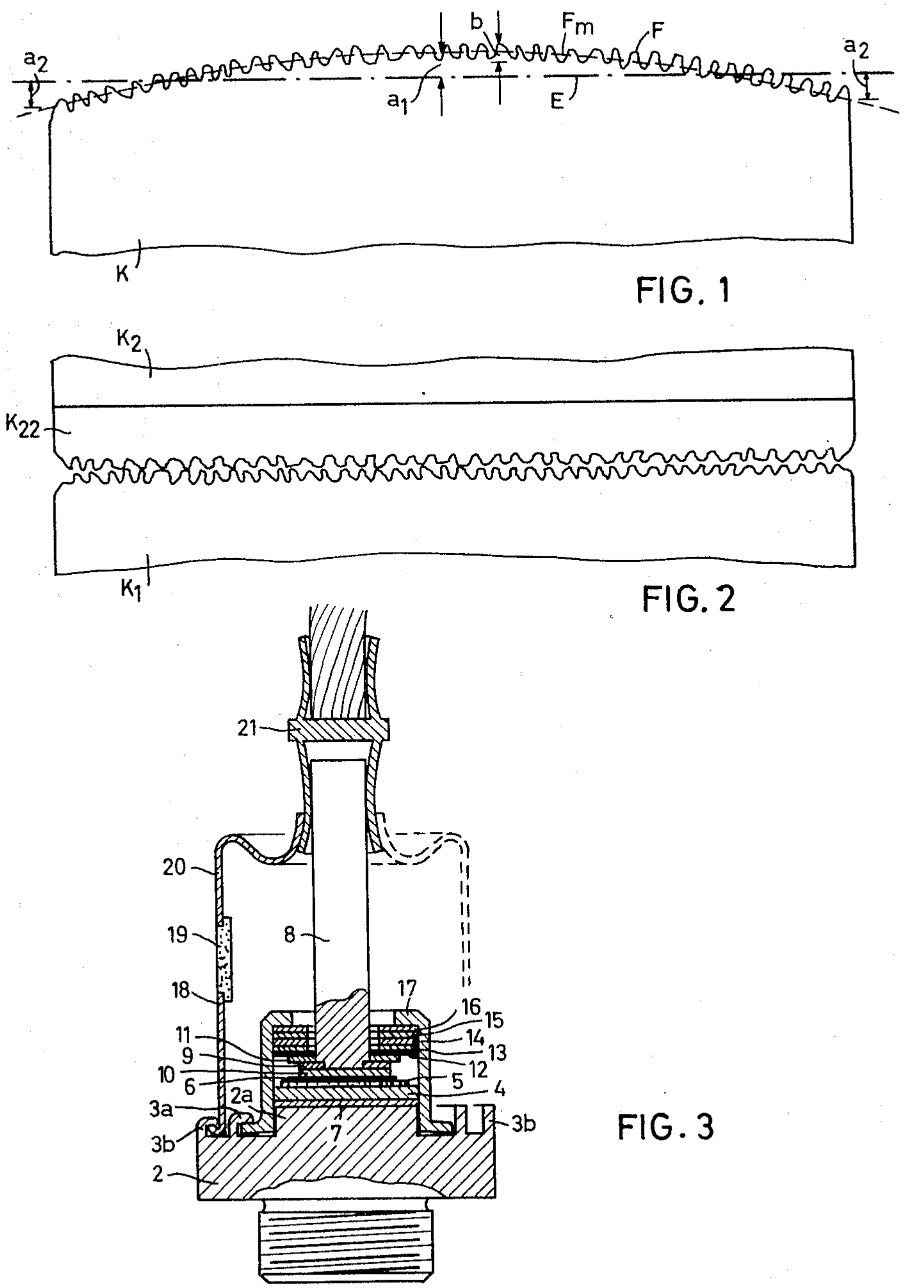
FIG. 1 is explanatory and shows diagrammatically a sectional view of a contact surface for the purpose of demonstrating the terms "roughness depth" and "median surface."
FIG. 2 is an explanatory and diagrammatic showing of a pressure-contact connection according to the invention in a representation similar to that of FIG. 1.
FIG. 3 is a sectional view of a silicon power rectifier of the diode type according to the invention.

Denoted in FIG. 1 by K is a portion of a pressure contact whose contact surface F is uniformly rough. The illustration is on a greatly enlarged scale, the vertical dimensions being much more enlarged than the horizontal ones to make the roughness more clearly apparent.

The "roughness depth" is indicated by the distance $b$ between the bottom of a groove and the most outwardly protruding point or crest of an adjacent projection, and denotes the depth value averaged over the entire contact surface F in the assumption that the individual depth values do not essentially depart from each other on account of the uniformity in roughness.

The "medium surface" $F_m$, represented by a broken, curved line, is developed from the rough surface F by observing the condition that the total volume of all recesses below the surface $F_m$ is equal to the total volume of all projections protruding upwardly beyond the surface $F_m$. Drawn through the median surface $F_m$ is a geometric plane E which extends perpendicularly to the plane of illustration and is indicated by a dot-and-dash line. This plane is so located that the departures of the median surface $F_m$ above and below the plane E are of equal size. The largest departure of the surface $F_m$ from the plane E upwardly is denoted by $a_1$ and is located at about the middle of the contact surface F. The largest departures of the surface $F_m$ from the plane E downwardly are located at the two outer edges of the contact surface and are denoted by $a_2$. In other words, the position of the plane E is defined by the condition that $a_1=a_2$. Any rounding of the edges is disregarded by extrapolating the broken line $F_m$ toward both edges with the same amount of curvature as in the adjacent, not appreciably rounded circular or annular zone of the contact surface. The intersections of these extrapolated extensions with the lateral (vertical) boundary lines of the contact K thus constitute one end point for determining the dimensions $a_2$, whose other end point is determined by the geometric plane E.

Since the amounts of departure $a_1$ and $a_2$, as shown in FIG. 1, are larger than the roughness depth $b$, it will be recognized that the contact surface F, as diagrammatically represented in FIG. 1, would not satisfy the requirements of the invention.

In contrast thereto, the pressure-contact conditions to be met by a semiconductor device according to the invention are satisfied by the contact $K_1$ of which a portion is shown in FIG. 2 on a similar scale and in the same manner as in FIG. 1. The contact surface of contact $K_1$ in FIG. 2 is virtually planar. The planar shape can be produced by an optical grinding method or by the same lapping method as conventionally employed for preparing or finishing semiconductor wafers of silicon or germanium. The lapping of the contact surface is performed by employing a lapping agent or abrasive of such a fine granulation that the prescribed roughness depth is secured.

The encapsuled rectifier illustrated in FIG. 3 comprises a massive copper block 2 of circular shape which has an integral threaded bolt and serves as a heat-sink structure. The copper block 2 is provided with a central projection or pedestal 2*a* upon which the carrier plate of the semiconductor assembly proper is fastened. An annular projection 3*a* concentrically surrounding the projection 2*a* serves for fastening a clamp or holder 17. An annular concentric edge portion 3*b* of the copper block, protruding upwardly in concentric relation to the projection 2*a*, serves for fastening a housing portion of the capsule to the copper block, as will be more fully described below. Mounted on the central projection 2*a* is the rectifier assembly proper, consisting of a sandwich composed of a carrier plate 4, a semiconductor disc 5 alloy-bonded with the carrier plate 4, an electrode 6 area-bonded with the semiconductor plate and forming a p-n junction therewith. The rectifier sandwich assembly can be produced, for example, as follows.

Placed upon a molybdenum disc of about 20 mm. diameter and 2 to 3 mm. thickness is a disc of aluminum foil about 19 mm. in diameter and about 0.05 mm. thick. Placed on top of the aluminum disc is a circular body of monocrystalline p-type silicon of about 1000 ohm cm. specific resistance. The silicon body has a diameter of about 18 mm. and a thickness of 0.3 mm. Then follows a gold foil of 0.1 mm. thickness, containing about 0.5% by weight of antimony, the diameter of the foil being smaller than that of the silicon body, for instance 14 mm.

This sandwich assembly is embedded in a powder that does not react with the just-mentioned materials and does not melt at the alloying temperature. Suitable as such powder is graphite. The embedded assembly is then heated within the embedding powder under pressure to a temperature of about 800° C. The heating can be effected in an alloying furnace evacuated or filled with protective gas. Thereafter the assembly is permitted to cool to room temperature. Then the two flat sides of the sandwich are lapped to planar shape with the aid of a grinding agent of suitable fine-granular constitution and are thereafter cleaned from the lapping residues.

During the alloying procedure just described, the gold foil becomes alloyed together with the adjacent zone of the silicon, and the alloyed region becomes doped with antimony and assumes n-type conductance, thus forming a p-n junction in the silicon body. Upon completion of the lapping operation, the outer edge of the p-n junction emerges at the free semiconductor surface. This surface is then subjected to etching which can be carried out in known manner, for example as described in U.S. Patent 3,010,885 or U.S. Patent 3,041,225. Residues of the etching agent can be rinsed off with distilled water. It is preferable to follow the etching operation by an oxidation process, for example as described in U.S. Patent 3,010,-885, or by rinsing with a ten times or more diluted solution of the chemical etching agent previously employed, or also by subjecting the assembly for a few minutes to an atmosphere to which vapor from this etching agent has been added.

According to FIG. 3, a thick silver layer 7 is interposed between the molybdenum carrier plate 4 of the rectifier sandwich assembly described above and the central projection 2*a* of the copper body 2. The silver layer 7 consists of a foil having 0.1 to 0.2 mm. thickness.

The foil 7 is preferably provided on both sides with a raised pattern, for example a waffle pattern similar to the knurling of knurled knobs. According to a preferred embodiment, the silver foil is first degassed by annealing and subsequently etched, for example with the aid of nitric acid, whereby a fine etching pattern on the surface is produced.

Placed upon the top side of the semiconductor assembly, that is upon the electrode 6 consisting of a gold-silver eutectic, is a plunger-shaped member 8, 9, 10. Before being assembled with the rectifier sandwich, this member is preferably composed of its individual components, namely a copper pin 8, a washer 9 of copper and a disc 10 of molybdenum. The three parts 8, 9, 10 are firmly joined with each other. This can be done by hard soldering. The bottom side of the molybdenum disc 10 is preferably silver plated. The molybdenum disc 10 is 1 to 2 mm. thick. Its silver coating 10*c* has a thickness between 0.1 and 0.2 mm. The contact surface of coating 10*c* is thereafter lapped in the above-described manner to a degree such that it will exhibit the same uniform roughness depth and the same high degree of flatness as the counter contact surface of the gold-containing electrode 6.

Surrounding the plunger-shaped member are a steel washer 11, a mica disc 12, another steel washer 13, and three ring-shaped springs or saucer springs 14, 15 and 16. The springs have curved shape when not under pressure. After assembling these parts, a bell-shaped holder 17 is placed over the copper pin 8. The holder 17 has a bottom flange which is thereafter fastened to the copper body 2 by bending the projection 3*a* from the straight shape shown on the right-hand side of FIG. 3 to the deformed shape shown at the left-hand side. The upper part of the holder 17 constitutes an abutment for the saucer springs 14, 15, 16 which, in assembled condition of the semiconductor device, are compressed to planar shape and then exert the necessary contact pressure against the rectifier sandwich, thus forcing the sandwich with its molybdenum carrier plate 4 against the silver layer 7. As explained, the silver layer 7 coalesces with the copper block 2, and the contact surfaces between the molybdenum carrier plate 4 and the silver coating 7 then constitute a pressure contact.

As apparent from FIG. 3, a device according to the present invention affords an extremely compact design in which all component parts are accurately secured in proper position to one another and therefore cannot become displaced by mechanical jarring nor by thermal displacements. Essential in this respect is the function of the mica disc 12 which serves for electrically insulating the holder 17 from the top side of the semiconductor assembly as well as for centering the pin 8. For this purpose the outer edge of the mica disc 12 abuts against the cylindrical inner wall of the holder 17, and the inner edge of the mica disc 12 touches the copper pin 8.

The assembling work is completed by placing a bell-shaped housing portion, composed of individual parts 18, 19, 20 and 21, over the entire arrangement so far described. As its lower rim, the part 18 has an outwardly projecting flange which is fastened to the copper block 2 by deforming the marginal projection 3*b* of the block, shown in original shape at the right-hand side of FIG. 4 and in ultimate shape at the left-hand side. The copper pin 8 is joined with the housing by compressing the part 21 firmly against the top portion of pin 8. The part 21 preferably consists of copper, whereas the parts 18 and 20 consist of steel or an iron-nickel-cobalt alloy such as available in the trade under the trade names Kovar or Vacon. Parts 20 and 21 are soldered or welded to each other. Part 19 is insulating and preferably consists of ceramic material. It is metallized at those places where it is joined with parts 18 and 20 so that they can be joined with part 19 by soldering. A cable 22, inserted in the part 21 from the outside, is joined therewith by a compressed connection.

After the device is fully assembled as described, a firm and permanent connection comes about between the pressure contact surfaces formed by the silver coating 10*c* on molybdenum plate 10 and by the adjacent gold-containing electrode 6 of the crystalline silicon body 5. This firm bonding is produced, on account of the intimate pressure engagement, by the heat developed during the electric operation of the device, causing the two mutually contacted parts to inseparably coalesce by partial and mutual diffusion of gold and silver particles across the contact area.

Such a firm connection can also be obtained in the production stage by moderately heating the members pressed against each other, at a temperature of, for instance, 150 to 250° C., for a period of several hours.

In the same manner an inseparable connection is also formed below the molybdenum disc 4 between the silver foil 7 and the projection or pedestal 2*a* of the copper body 2.

Contrary thereto, the mutual contact surfaces of the molybdenum disc 4 and of the silver foil 7 maintain their ability of gliding laterally upon each other, since the metals molybdenum and silver practically will not alloy with each other at the occurring temperatures. Consequently, differences in thermal expansions are compensated by mutual radial movement of the surfaces relative to each other without causing mechanical stresses.

It will be understood that the rectifier assembly proper, comprising the semiconductor body with the alloyed electrodes and alloy-bonded carrier plate, may have a constitution and design other than illustrated and described. For example, the semiconductor body may consist of germanium with alloy-bonded electrodes of indium or lead-arsenic. The carrier plate may consist, for example, of certain highly alloyed types of steel, particularly those containing nickel and cobalt, which possess a similar coefficient of expansion as the semiconductor material, such as germanium or silicon. The semiconductor body may also consist of silicon carbide or of an intermetallic (III–

V) compound of respective elements from the third and fifth groups respectively of the periodic system of elements, or the semiconductor body may consist of a (II–VI) compound of respective elements from the second and sixth groups of the periodic system, semiconductor compounds of these types, as well as electrode and carrier-plate metals suitable therefore, being known for such purposes (for example, from the book Semiconductors, edited by N. B. Hannay, published 1959 by Reinhold Publishing Corp., New York, chapter 9 and pertaining bibliography).

Another advantage of the invention as described in the foregoing residues is the fact that the rectifier assembly, comprising the semiconductor body 5 with alloyed electrode 6 and carrier or connecting plates 4, can also be inserted into the capsule in reversed electric orientation. This affords providing semiconductor diodes which have respectively different polarities but the same external design, the same electric characteristics, and also a similar internal design.

Figure 4:
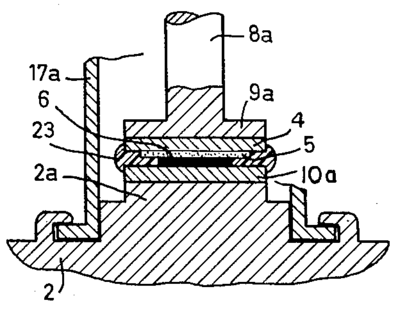
FIG. 4 is a fragmentary view, also in section of another semiconductor rectifier according to the invention.
Figure 5:
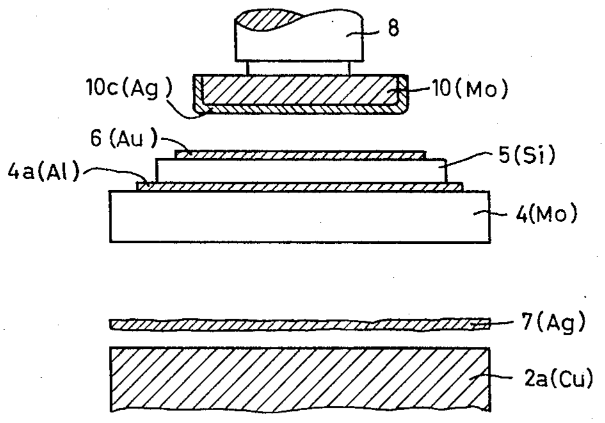
FIG. 5 shows schematically and in section an exploded view of some of the components assembled in the device according to FIG. 3.

An example of such a device is partially illustrated in FIG. 4, it being understood that the device otherwise corresponds to that described above with reference to FIG. 3. In the embodiment according to FIG. 4, the molybdenum plate 10*a* above the semiconductor disc 5 has the same size as the lower molybdenum plate 4. The connection between the plunger-shaped connector of copper, whose two parts 8*a* and 9*a* here are made of a single integral piece, and the plate 4 constitutes a pressure-contact connection in the same manner as the lower pressure-contact connection in FIG. 3 between the molybdenum plate 4 and the base 2*a* of the copper body 2. That is to say, the part 9*a* posseses on its lower surface a pressure-contacted silver foil laterally glidable upon the molybdenum plate 4. The pedestal 2*a* of FIG. 4 also possesses on its upper surface a pressure-contacted silver foil 7 laterally glidable upon the plate 10*a*. Such glidability can be augmented by means of graphite powder sprinkled between the two parts of the pressure-contact connection when assembling the device. This does not impair the good current and heat transfer properties. The invention also contemplates that in FIG. 4 the plate 10*a* be firmly joined by hard soldering to pedestal 2*a*.

Since the molybdenum plate 10*a*, on account of its large diameter, protrudes beyond the annular free surface of the semiconductor body at which the p–n junction emerges, it is further of advantage to protect this surface portion by coating it with a thin layer of varnish. Suitable for this purpose, for example, is a silicone varnish with an addition of alizarin which is applied to the semiconductor material subsequent to the above-mentioned ultimate etching, rinsing and oxidation treatment. The remaining interspace between the two equal-size molybdenum plates 4 and 10*a* is preferably filled with casting resin 23 which may be permitted to bulge and protrude outwardly as shown. This considerably increases the breakthrough voltage of the semiconductor device.

The subassembly comprising the two molybdenum plates 4 and 10*a* also can be arranged in reverse order without changing the arrangement of all other parts of the device, namely so that the plate 10*a* is on top and the plate 4 at the bottom of the semiconductor disc 5. In this case the forward direction of current flow is from bottom to top.

While the above-described embodiments relate to rectifier diodes, it will be obvious that the invention is not limited thereto but is likewise applicable to other semiconductor diodes with and without p-n junction, as well as to semiconductor triodes, such as transistors, four-layer devices of the p-n-p-n type such as semiconductor controlled rectifiers or switching devices, photoelements and phototransistors, and also in multiple-component devices in which a plurality of such diodes and/or triodes are combined in a single semiconductor body.

The invention contemplates the members 4, 10, 10*a* being comprised of tungsten or chromium as well as molybdenum, and other metals such as those previously mentioned for this purpose.

Upon a study of this disclosure, such and other modifications with respect to design, number of components, and materials will be obvious to those skilled in the art and are indicative of the fact that my invention can be given embodiments other than particularly illustrated and described herein, without departing from the essential features of the invention and within the scope of the claims annexed hereto.

I claim:

1. An electronic semiconductor device comprising a plate-shaped and substantially monocrystalline semiconductor body with a broad-area electrode of metallically conducting ductile material, a conducting terminal structure having a contact-pressure plate of metal whose thermal coefficient of expansion is similar to that of said semiconductor body, said plate having a coating of contact metal thermo-compressively bonded with said electrode material, spring means connected with said structure for pressing said body and said plate together, said coating and said electrode having respective planar surfaces in area contact with each other, at least one of said contact surfaces being substantially uniformly rough and having a roughness depth between 0.5 to 50 microns.

2. An electronic semiconductor device comprising a plate-shaped and substantially monocrystalline semiconductor body of material from the group consisting of silicon and germanium, said body having a broad-area electrode containing metal, a conducting terminal structure having a contact-pressure plate of metal from the group consisting of molybdenum, tungsten and chromium, said plate having a coating of contact metal thermo-compressively bonded with said electrode metal, spring means connected with said structure for pressing said body and said plate together, said coating and said electrode having respective planar surfaces in area contact with each other, at least one of said contact surfaces being substantially uniformly rough and having a roughness depth between 0.5 to 50 microns.

3. An electronic semiconductor device comprising a plate-shaped and substantially monocrystalline semiconductor body of material from the group consisting of silicon and germanium, said body having a broad-area electrode consisting essentially of gold-semiconductor alloy, a conducting terminal structure having a contact-pressure plate of metal from the group consisting of molybdenum, tungsten and chromium, said plate having a coating formed substantially of metal from the group consisting of gold and silver, spring means connected with said structure for pressing said body and said plate together, said coating and said electrode having respective planar surfaces in area contact with each other and bonded to each other, at least one of said contact surfaces being substantially uniformly rough and having a roughness depth between about 1 and about 3 microns.

4. In a semiconductor device according to claim 1, said contact-metal coating on said pressure plate having a thickness at least equal to twice the roughness depth of said contact surface.

5. In a semiconductor device according to claim 1, said contact-metal coating on said pressure plate consisting of a foil brazed to said plate and having a thickness at least equal to twice the roughness depth of said contact surface.

6. In a semiconductor device according to claim 1, said contact coating having on its contact surface a pattern of grooves subdividing the surface area, said grooves having a depth larger than said roughness depth of said contact surface.

7. In a semiconductor device according to claim 1, said contact surfaces having an area of mutual engagement larger than 0.5 $cm.^2$.

8. An electronic semiconductor device comprising a substantially monocrystalline semiconductor body of circular disc shape, a carrier plate of approximately the same thermal coefficient of expansion and at least the same diameter as said body firmly bonded to one flat disc side thereof, a metallically conducting electrode of smaller diameter than said body bonded to the other flat side thereof, said body having a p-n junction adjacent to said electrode, a mounting structure having two mutually insulated contact members of which one is in area contact with said carrier plate, said other contact member having a pressure plate of metal whose thermal coefficient of expansion substantially corresponds to that of said semiconductor body, said pressure plate having a coating of contact metal thermo-compressively bonded with said electrode, said coating and said electrode having respective planar surfaces in area contact with each other, spring means disposed between said two contact members for pressing said coated pressure plate against said electrode, at least one of said contact surfaces being substantially uniformly rough and having a roughness depth between 0.5 to 50 microns.

9. An electronic semiconductor device comprising a crystalline silicon body of circular disc shape, a carrier plate of metal from the group consisting of molybdenum and tungsten, said carrier plate having at least the same diameter as said body firmly bonded to one flat disc side thereof, an electrode substantially consisting of gold alloy and having a smaller diameter than said body and being bonded to the other flat side thereof, a mounting structure having two mutually insulated contact members of which one is in area contact with said carrier plate, said other contact member having a pressure plate also formed of metal from the aforesaid group, said pressure plate having a coating of contact metal from the group consisting of silver and gold, said coating and said electrode having respective planar surfaces in area contact with each other and bonded to each other, said carrier plate and said one contact member having respective planar surfaces touching each other and at least one of them having uniform roughness with a roughness depth between 0.5 and 50 microns, spring means disposed between said two contact members for pressing said members toward each other.

10. The method of producing a rigid and permanent broad-area connection between the metallic surface electrode of a crystalline semiconductor body and a contacting plate of metal having a thermal coefficient of expansion similar to that of the semiconductor body, which comprises coating the plate at its contacting surface with a metal theremocompressively bonded to the electrode, giving the respective surfaces of electrode and coating a planar shape and at least one of them a uniform roughness of a roughness depth between 0.5 and 50 microns, assembling the semi-conductor body and plate with said electrode and coating surfaces in face-to-face engagement with each other in an area of more than 0.5 cm.$^2$, holding the assembly under mechanical contact pressure between 50 to 500 kg. per cm.$^2$ at said area, and thereafter heating the assembly under said pressure to an elevated temperature below the fusion temperatures of said electrode and plate and coating so as to cause coalescence of said electrode with said coating.

11. In the method of producing a broad-area connection with a semiconductor body according to claim 10, said temperature being 150 to 250° C.

12. The method of producing broad-area connections on opposite sides of a plate-shaped crystalline semiconductor body having on one flat side a bonded metallic electrode and on the other a bonded carrier plate of a similar thermal coefficient of expansion as said body, which comprises assembling the semiconductor body between two terminal conductors of which one has face-to-face relationship with said electrode, a contact plate of metal whose thermal coefficient of expansion is also similar to that of said semiconductor body whereas the other terminal conductor lies face-to-face against said carrier plate, giving each of the mutually contacting surfaces prior to assembling a planar shape and at least one surface of each pair a uniform roughness of 0.5 to 50 microns roughness depth, clamping the body and the two terminal conductors when assembled against one another by spring force, and subjecting the clamped assembly to heating at elevated temperature between about 100 and about 300° C., whereby the electrode of said semiconductor body firmly coalesces with the adjacent terminal conductor to form a rigid joint whereas the carrier plate remains laterally displaceable relative to the other terminal conductor for compensation of differences in thermal expansion.

13. In the method of producing a broad-area connection with a semiconductor body according to claim 12, said spring force corresponding to a contact pressure between 50 and 500 kg. per cm.$^2$.

14. An electronic semiconductor device comprising a plate-shaped and substantially monocrystalline semiconductor body of material from the group consisting of silicon and germanium, said body having a broad-area electrode containing metal, a carrier body bonded to said semiconductor body at a surface opposite said electrode, a conducting terminal structure having a contact-pressure plate of metal from the group consisting of molybdenum, tungsten and chromium, said plate having a coating of contact metal thermo-compressively bonded with said electrode metal, spring means connected with said structure and said carrier body for pressing said semiconductor body and said plate together, said coating and said electrode having respective planar surfaces in area contact with each other, at least one of said contact surfaces being substantially uniformly rough and having a roughness depth between 0.5 to 50 microns, said spring means including two conductive members respectively located opposite said plate and said carrier body, and a silver foil on one of said conductive members in pressure alignment with said carrier body and said plate.

15. An electronic semiconductor device comprising a plate-shaped and substantially monocrystalline semiconductor body of material from the group consisting of silicon and germanium, said body having a broad-area electrode containing metal, a carrier body bonded to said semiconductor body at a surface opposite said electrode, a conducting terminal structure having a contact-pressure plate of metal from the group consisting of molybdenum, tungsten and chromium, said plate having a coating of contact metal thermo-compressively bonded with said electrode metal, spring means connected with said structure and said carrier body for pressing said semiconductor body and said plate together, said coating and said electrode having respective planar surfaces in area contact with each other, at least one of said contact surfaces being substantially uniformly rough and having a roughness depth between 0.5 to 50 microns, said spring means including two conductive members respectively located opposite said plate and said carrier body, and two silver foils one on each of said members respectively contacting said plate and said carrier body.

16. An electronic semiconductor device comprising a plate-shaped and substantially monocrystalline semiconductor body of material from the group consisting of silicon and germanium, said body having a broad-area electrode containing metal, a carrier body bonded to said semiconductor body at a surface opposite said electrode a conducting terminal structure having a contact-pressure plat eof metal from the group consisting of molybdenum, tungsten and chromium, said plate having a coating of contact metal thermo-compressively bonded with said electrode metal, spring means connected with said structure and said carrier body for pressing said semiconductor body and said plate together, said coating and said electrode having respective planar surfaces in area contact with each other, at least one of said contact surfaces being substantially uniformly rough and having a roughness depth between 0.5 to 50 microns, said spring means including two conductive members respectively located opposite said plate and said carrier body, and a silver foil between said plate and one of said members, said other member being fixedly joined to said carrier body.

17. An electronic semiconductor device comprising a plate-shaped and substantially monocrystalline semiconductor body of material from the group consisting of silicon and germanium, said body having a broad-area electrode containing metal, a carrier body bonded to said semiconductor body at a surface opposite said electrode, a conducting terminal structure having a contact-pressure plate of metal from the group consisting of molybdenum, tungsten and chromium, said plate having a coating of contact metal thermo-compressively bonded with said electrode metal, spring means connected with said structure and said carrier body for pressing said semiconductor body and said plate together, said coating and said electrode having respective planar surfaces in area contact with each other, at least one of said contact surfaces being substantially uniformly rough and having a roughness depth between 0.5 to 50 microns, said spring means including two conductive members respectively located opposite said plate and said carrier body, and a silver foil between said carrier body and one of said members, said other member being fixedly joined to said plate.

References Cited by the Examiner

UNITED STATES PATENTS

| | | | |
|---|---|---|---|
| 2,244,771 | 6/1941 | Figour | 317—238 |
| 2,863,105 | 12/1958 | Ross | 317—234 |
| 2,933,662 | 4/1960 | Boyer et al. | 317—234 |
| 2,957,112 | 10/1960 | Sils | 317—234 |
| 3,050,667 | 8/1962 | Emeis | 317—240 |
| 3,059,157 | 10/1962 | English et al. | 317—234 |

JOHN W. HUCKERT, *Primary Examiner.*

J. KALLAM, *Assistant Examiner.*